United States Patent
Murgai et al.

(10) Patent No.: US 7,246,335 B2
(45) Date of Patent: Jul. 17, 2007

(54) ANALYZING SUBSTRATE NOISE

(75) Inventors: Rajeev Murgai, Santa Clara, CA (US);
Subodh M. Reddy, San Jose, CA (US);
Takashi Miyoshi, San Jose, CA (US);
Takeshi Horie, Palo Alto, CA (US);
Mehdi B. Tahoori, Brookline, MA (US)

(73) Assignee: Fujitsu Limited, Kawasaki (JP)

( * ) Notice: Subject to any disclaimer, the term of this patent is extended or adjusted under 35 U.S.C. 154(b) by 136 days.

(21) Appl. No.: 11/058,900

(22) Filed: Feb. 15, 2005

(65) Prior Publication Data

US 2006/0184904 A1    Aug. 17, 2006

(51) Int. Cl.
G06F 9/45     (2006.01)
G06F 17/50    (2006.01)

(52) U.S. Cl. .................. 716/6; 716/2; 716/4; 716/5

(58) Field of Classification Search .............. 716/1–21; 703/14–23
See application file for complete search history.

(56) References Cited

U.S. PATENT DOCUMENTS

| | | | | |
|---|---|---|---|---|
| 6,690,066 | B1* | 2/2004 | Lin et al. ..................... | 257/355 |
| 6,941,258 | B2* | 9/2005 | Van Heijningen et al. .... | 703/16 |
| 7,039,536 | B2* | 5/2006 | Nagata et al. ................ | 702/70 |
| 2005/0005254 | A1* | 1/2005 | Hirano et al. ................. | 716/5 |

OTHER PUBLICATIONS

Badaroglu et al., High-level Simulation of Substrate Noise Generation from Large Digital Circuits with Multiple Supplies, 2001, IEEE, pp. 326-330.*

Murgai et al., Sensitivity-based Modelling and Methodology for Full-Chip Substrate Noise analysis, 2004, IEEE, pp. 610-615.*

Albuquerque et al., "Evaluation of Substrate Noise in CMOS and Low-Power Logic Cells," ISCAS, Conference Proceedings, vol. IV, 6 pages, 2001.

Badaroglu et al., "High-Level Simulation of Substrate Nosie Generation from Large Digital Circuits with Multiple Supplies," IEEE 2001, pp. 326-330.

Braire et al., "Principles of Substrate Crosstalk Generation in CMOS Circuits," TRANSCAD, vol. 19, No. 6, Jun. 2000.

Charbon et al., "Modeling Digital Substrate Noise Injection in Mixed-Signal IC's," TRANSCAD, vol. 18, No. 3, Mar. 1999.

Heijningen et al., "High-Level Simulation of Substrate Noise Generation Including Power Supply Noise Coupling," DAC, 2000.

Heijningen et al., "Substrate Noise Generation in Complex Digital Systems: Efficient Modeling and Simulation Methodology and Experimental Verification," IEEE JSSC, vol. 37, No. 8, Aug. 2002.

(Continued)

*Primary Examiner*—Paul Dinh
*Assistant Examiner*—Nghia M. Doan
(74) *Attorney, Agent, or Firm*—Baker Botts L.L.P.

(57) ABSTRACT

In one embodiment, a method for analyzing substrate noise includes applying a static timing analysis (STA) algorithm to a description of a digital circuit. Application of the STA algorithm generates timing information on one or more gates in the digital circuit. The method also includes applying a current waveform generation (CWG) algorithm to the description of the digital circuit, the timing information on one or more gates in the digital circuit, and a description of switching activity in the digital circuit. Application of the CWG algorithm generates a current waveform. The method also includes generating a reduced model (RM) of the digital circuit for simulation according to the description of the digital circuit, the current waveform, and a model of a package associated with the digital circuit. Simulation of the RM of the digital circuit generates an indication of noise in a substrate associated with the digital circuit.

34 Claims, 6 Drawing Sheets

OTHER PUBLICATIONS

Heijningen et al., "Modeling of Digital Substrate Noise Generation and Experimental Verification Using a Novel Substrate Noise Sensor", 1993.

Murgai et al., "Sensitivity-Based Modeling and Methodology for Full-Chip Substrate Noise Analysis," DATE, 2004.

Nagata et al., "Modeling Substrate Noise Generation in CMOS Digital Integrated Circuits," CICC, 2002.

Nagata et al., "Substrate Noise Analysis with Compact Digital Noise Injection and Substrate Models," Int'l Conf. on VLSI Design, 2002.

Nagata et al., "Measurements and Analyses of Substrate Noise Waveform in Mixed-Signal IC Environment," TRANSCAD, vol. 19, No. 6, Jun. 2000.

Nagata et al., Effects of Power-Supply Parasitic Components on Substrate Noise Generation in Large-Scale Digital Circuits, Symp. on VLSI Circuits, Digest of Technical Papers, 2001.

Nardi et al., "A Methodology for the Computation of an Upper Bound on Noise Current Spectrum of CMOS Switching Activity," ICCAD, pp. 778-785, Nov. 2003.

Ozis et al., "An Efficient Modeling Approach for Substrate Noise Coupling Analysis," ISCAS, pp. 237-240, 2002.

Samavedam et al., "A Scalable Substrate Noise Coupling Model for Design of Mixed-Signal IC's", IEEE JSSC, vol. 35, No. 6, Jun. 2000.

Verghese et al., "Simulation Techniques and Solutions for Mixed-Signal Coupling in Integrated Circuits," Kluwer Academic Publishers, 1995.

Zanella et al, "Modeling of Substrate Noise Injected by Digital Libraries," ISQED, pp. 448-492, 2001.

Zinzius et al., "Evaluation of the Substrate Noise Effect on Analog Circuits in Mixed-Signal Designs," Southwest Symp. on mixed-signal designs, pp. 131-134, 2000.

* cited by examiner

ANALYZING SUBSTRATE NOISE

TECHNICAL FIELD OF THE INVENTION

This invention relates generally to designing chips and more particularly to analyzing substrate noise (SN).

BACKGROUND

Mixed-signal designs have become ubiquitous with the proliferation of deep submicron (DSM) system-on-chip (SoC) design methodologies. In such designs, maintaining signal integrity and reducing noise have become vexing issues. Switching noise due to large signal swings in the digital part can propagate through the common substrate and corrupt sensitive analog components. In designs that have low resistivity substrates, noise generated in one region of the die may cause the rest of the chip to malfunction. Decreasing feature size lets more devices to be packed on a chip, generating higher overall noise. Smaller devices are also more sensitive to noise because of reduced noise margins. The increasing switching rates and decreasing transition times are also responsible for more transients. Due to these DSM effects, SN analysis (SNA) has become a critical problem in most mixed-signal designs.

Traditionally, SPICE has been the primary tool used by designers for noise analysis. However, it is not feasible to use SPICE on a block having even 100,000 gates. Research work has been done on modeling SN during design phases. Much of this research derives a passive network model that can be simulated with SPICE to yield substrate noise patterns for the entire design for the set of input vectors from a testbench. Each cell in the library is simulated with SPICE for all possible inputs and power supply current and substrate injection currents are extracted. This knowledge is used to do a full-chip analysis. One problem with at least some previous approaches is that they do not consider package inductance and the associated power supply noise, and hence are not very practical. Some previous approaches do not consider the dependency of noise on the load at each gate. In at least one previous approach, a time-series divided parasitic capacitance model is use for time-domain power supply current estimation. Previous approaches are typically input-pattern dependent, i.e., a separate model must be derived for each input pattern. Even for a moderately sized design, the number of models can become very large. This leads to exorbitant run times, making these approaches impractical for a full-chip analysis. Also, there is no guarantee that the maximum noise will be reported, since the worst-case input pattern may not be present in the testbench.

SUMMARY

According to the present invention, disadvantages and problems associated with chip design may be reduced or eliminated.

In one embodiment, a method for analyzing substrate noise includes applying a static timing analysis (STA) algorithm to a description of a digital circuit. Application of the STA algorithm generates timing information on one or more gates in the digital circuit. The method also includes applying a current waveform generation (CWG) algorithm to the description of the digital circuit, the timing information on one or more gates in the digital circuit, and a description of switching activity in the digital circuit. Application of the CWG algorithm generates a current waveform. The method also includes generating a reduced model (RM) of the digital circuit for simulation according to the description of the digital circuit, the current waveform, and a model of a package associated with the digital circuit. Simulation of the RM of the digital circuit generates an indication of noise in a substrate associated with the digital circuit.

Particular embodiments of the present invention may provide one or more technical advantages. As an example, particular embodiments provide high-level models, methods, or both facilitating chip-level analysis. Particular embodiments significantly reduce time requirements associated with SNA, which may accommodate the iterative nature of existing design flows. Particular embodiments provide a full-chip SNA methodology based on static timing analysis (STA) and reduced passive SN models. Particular embodiments use a pattern-independent methodology (PIM) for SNA without any testbench or simulation. Such embodiments run significantly faster than pattern-dependent flows used in previous approaches. Particular embodiments are suited to full-chip designs.

Particular embodiments use an RM based on sensitivity analysis that more accurately takes into account particular factors significantly influencing SN. Particular embodiments use a current waveform generation (CWG) technique. Such embodiments use STA, circuit topology, and cell functionality to derive a waveform corresponding to worst-case behavior. Particular embodiments take into account effects of a package on SN. Particular embodiments take into account influence of capacitive load driven by a gate in a circuit. Particular embodiments provide a more accurate model, methodology, or both for SNA. Particular embodiments provide a pattern-independent methodology for measuring peak-to-peak SN of a mixed-signal design. Particular embodiments provide an RM consisting only of a smallest possible number of passive components. Particular embodiments are extendable to frequency analysis, which may be applied to designs that include frequency-sensitive analog components.

Particular embodiments may provide all, some, or none of the technical advantages described above. Particular embodiments may provide one or more other technical advantages, one or more of which may be apparent, from the figures, descriptions, and claims herein, to a person having ordinary skill in the art

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
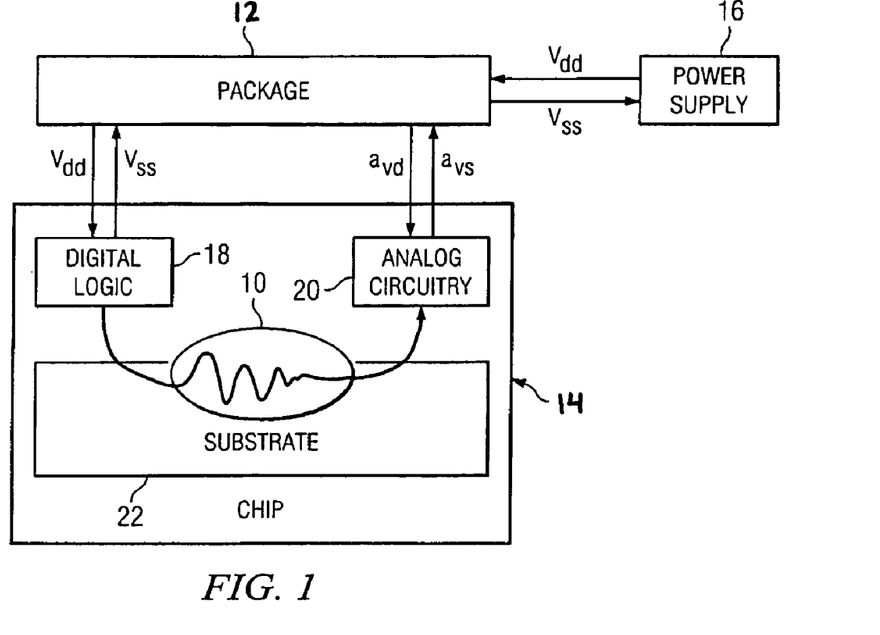
FIG. 1 illustrates example SN.

FIG. 1 illustrates example SN 10. Package 12 holds chip 14. In particular embodiments, chip 14 is an SoC device. Chip 14 includes digital logic 18, analog circuitry 20, and substrate 22. Substrate 22 is common to both digital logic 18 and analog circuitry 20. In particular embodiments, digital logic 18 and analog circuitry 20 are physically separate from each other. In particular embodiments, digital logic 18 and analog circuitry 20 are not physically separate from each other. Power supply 16 supplies power to chip 14. As an example and not by way of limitation, power supply 16 may generate a voltage difference, $V_{DD}$–$V_{SS}$, across one or more components of digital logic 18. $V_{DD}$ and $V_{SS}$ may be drain and source voltages, respectively, for digital logic 18. Power supply 16 may also generate a voltage difference, $A_{VD}$–$A_{VS}$, across one or more components of analog circuitry 20. $A_{VD}$ and $A_{VS}$ may be drain and source voltages, respectively, for analog circuitry 20.

SN 10 includes switching noise from transients in digital logic 18 that propagates through substrate 22, reaches analog circuitry 20, and adversely affects operation of analog circuitry 20. Leakage currents and power supply noise (or simultaneous switching noise) both contribute to SN 10. Junctions between wells and substrate 22 and between sources and drains and their respective wells form reverse-biased, parasitic diodes that conduct leakage currents to substrate 22. Inputs to gates in digital logic 18 draw current from power supply 16, and, because of resistance and inductance associated with current delivered from power supply 16 to digital logic 18, potentials associated with power supply 16 and a ground network change both spatially and temporally, which causes power supply noise and ground bounce. Because substrate 22 is connected to a ground potential, such ground bounce is reflected as SN 10. Power supply noise and ground bounce tend to contribute to SN 10 much more than leakage current does.

Figure 2:
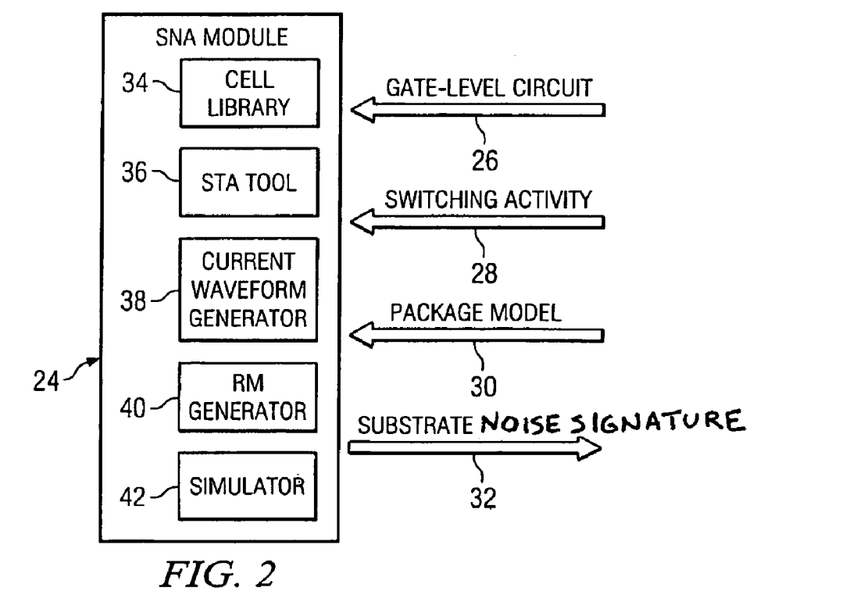
FIG. 2 illustrates an example SNA module for analyzing SN.

FIG. 2 illustrates an example SNA module 24 for analyzing SN 10. In particular embodiments, SNA module 24 is a software, hardware or embedded logic component or a combination of two or more such components. In particular embodiments one or more computer systems provide one or more users access to SNA module 24. Input to SNA module 24 includes a description 26 of digital logic 18, a description 28 of switching activity in digital logic 18, and a description 30 of package 12. In particular embodiments, description 28 of switching activity in digital logic 18 indicates one or more probabilities of switching activity (such as a transition from low to high or from high to low) in a clock cycle at one or more gates in digital logic 18. Output from SNA module 24 includes a description 32 of SN 10. In particular embodiments, description 32 of SN 10 indicates one or more signatures of SN 10, such as, for example, one or more voltages of SN 10.

SNA module 24 includes a cell library 34, an STA tool 36, a current waveform generator 38, an RM generator 40, and a simulator 42. In particular embodiments, instead of cell library 34 being a component of SNA module 24, cell library 34 is outside SNA module 24. As an example and not by way of limitation, in such embodiments, input to SNA module 24 may include cell library 34. As another example, in such embodiments, one or more components of SNA module 24 may access cell library 34 outside SNA module 24, according to particular needs. In particular embodiments, cell library 34, STA tool 36, current waveform generator 38, RM generator 40, and simulator 42 are all separate from each other. In particular embodiments, two or more of cell library 34, STA tool 36, current waveform generator 38, RM generator 40, and simulator 42 share one or more hardware, software, or embedded logic components or a combination of two or more such components with each other. Cell library 34 includes descriptions of gates used to analyze digital logic 18. As an example and not by way of limitation, the descriptions of the gates in cell library 34 may include timing information on the gates. STA tool 36 accesses description 26 of digital logic 18 and cell library 34 and executes an STA algorithm using description 26 and cell library 34 to generate timing information on each gate in digital logic 18. In particular embodiments, timing information on a gate indicates minimum and maximum rise and fall arrival and transition times at the gate, as described below. In particular embodiments, the STA algorithm executed by STA tool 36 implicitly captures best and worst circuit-timing behavior over all input patterns. In particular embodiments, SNA module 24 uses timing information from STA tool 36 to model SN 10 according to a worst-case scenario that maximizes peak-to-peak SN 10. In particular embodiments, use of an STA algorithm obviates simulation of digital logic 18 over multiple input patterns, which facilitates run-time improvement.

Current waveform generator 38 accesses description 26 of digital logic 18, description 28 of switching activity in digital logic 18, cell library 34, and timing information from STA tool 36 and executes a CWG algorithm using descriptions 26 and 28, cell library 34, and the timing information to generate a current waveform 48, as described below. RM generator 40 accesses description 26 of digital logic 18, description 30 of package 12, cell library 34, and a current waveform 48 from current waveform generator 38 and executes an algorithm using descriptions 26 and 30, cell library 34, and current waveform 48 to generate an RM 46 of digital logic 18 for simulation, as described below. RM 46 includes relatively few, passive components, which speeds up simulation of RM 46. Because RM 46 does not include any explicit primary inputs, RM 46 is independent of an input pattern. In particular embodiments, if digital logic 18 included a hierarchical design, SNA module 24 would compose different RMs 46 of different hierarchical components of digital logic 18 to process digital logic 18. Simulator 42 accesses an RM 46 of digital logic 18 from RM generator 40 and runs a simulation on RM 46 to generate description 32 of SN 10. In particular embodiments, simulator 42 includes SPICE.

Figure 3A:
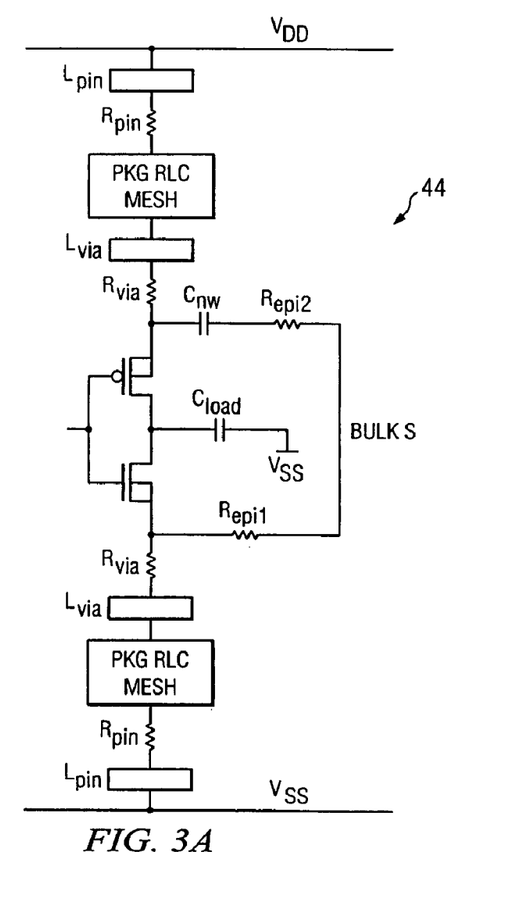
FIG. 3A illustrates an example reference model.
Figure 3B:
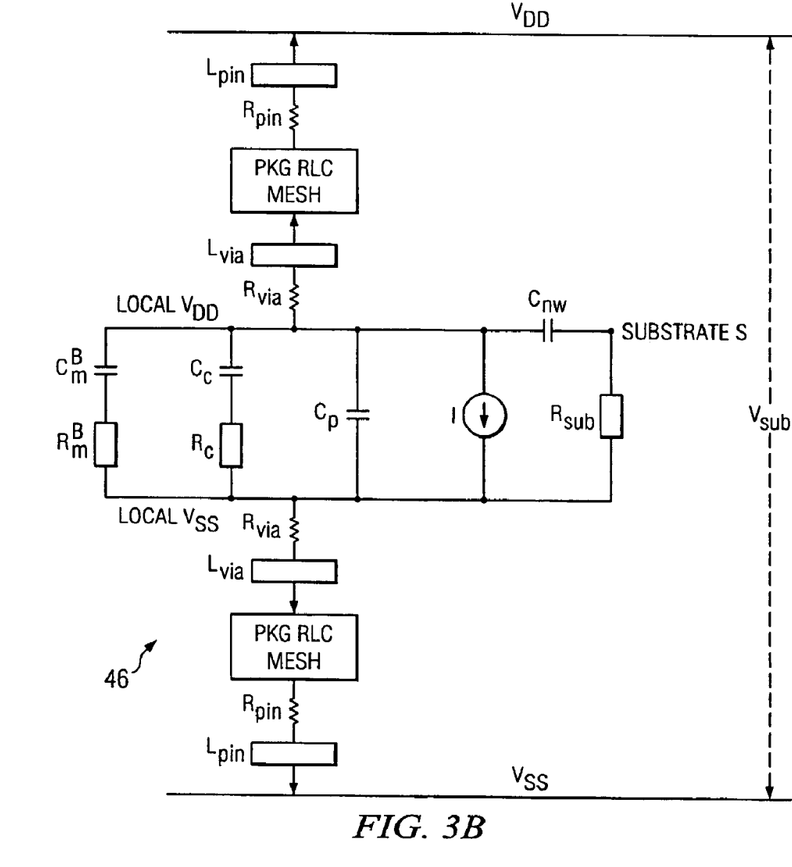
FIG. 3B illustrates an example RM of the reference model.

FIG. 3A illustrates an example reference model 44. FIG. 3B illustrates an example RM 46 of reference model 44. Reference model 44 models one inverter. Reference model 44 includes one substrate node BULK or S. A series connection of a capacitor $C_{nw}$ and a resistor $R_{epi2}$ connects the substrate node BULK to a PMOS transistor substrate node. $C_{nw}$ represents a reverse-biased NWELL to a P-epi layer junction diode. $R_{epi2}$ represents a P-epi layer resistance under the reverse-biased NWELL. A resistor $R_{epi1}$ connects a substrate node of an NMOS transistor to the substrate node S. $R_{epi1}$ represents a P-epi layer resistance under the NMOS transistor. Each block in reference model 44 has one $V_{DD}$, one $V_{SS}$, and one substrate node. $V_{SS}$ and $V_{DD}$ nodes are connected to a package model. SN 10 is measured at the substrate node BULK.

A sensitivity analysis of reference model 44 facilitates determining a minimum set of components of reference model 44 that should be modeled accurately in RM 46. The sensitivity analysis indicates that, because SN 10 is sensitive to current waveform 48 and package model, current waveform 48 and package model should be modeled accurately in RM 46

RM 46 models switching activity and includes only passive circuit elements: a current source, internal capacitors, and resistors. Capacitors and resistors model transistors, capacitance cells, and parasitics on power and ground networks. RM 46 also includes a package RLC mesh, $L_{via}$, $R_{via}$, $L_{pin}$, and $R_{pin}$. Including only a few circuit elements and only passive circuit elements in RM 46 facilitates faster simulation of RM 46 by simulator 42. In RM 46, $R_m^B$ and $C_m^B$ represent cumulative resistance and capacitance of transistors and wires in block B. $R_m^B$ is an average of pull-up and pull-down turn-on resistances of the transistors in block B. $C_m^B$ is a sum of all gate capacitances and wire loads in block B. As an example and not by way of limitation, for an inverter i, $C_m^i$ represents a load capacitance driven by i, which includes gate capacitances of fanout cells and a wire cap. If $R_n$ and $R_p$ are ON resistances of NMOS and PMOS transistors in reference model 44, respectively, $$R_m^i = \frac{R_n + R_p}{2}$$

if the inverter of reference model 44 is ON or OFF with equal probability, which is an approximation. $R_n$ and $R_p$ are functions of an operating point of the transistors, and are approximated by their average value in a linear region. The equivalent single value $R_m^B(C_m^B)$ for block B is computed by assuming that $R_m^i$s($C_m^i$s) of all cells i in block B are connected in parallel.

$$\frac{1}{R_m^B} = \sum_i \frac{1}{R_m^i}$$

$$C_m^B = \sum_i C_m^i$$

Figure 4:
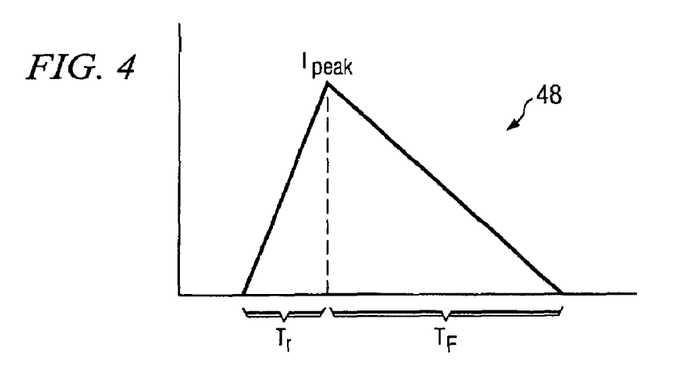
FIG. 4 illustrates an example model of a current waveform.

$C_c$ and $R_c$ represent decoupling capacitance cells at vacant areas in the layout that guard against voltage drop. $C_c$ and $R_c$ are computed from SPICE netlists of the decoupling capacitance cells and the layout. Computation of $C_c$ and $R_c$ is similar to computation of $C_m$ and $R_m$. $C_p$ represents parasitic capacitance on power or ground networks. $R_{sub}$ represents a p well substrate resistance. $C_{nw}$ represents a junction capacitance between an n well and the substrate S. $R_{via}$ and $L_{via}$ represent cumulative via resistance and inductance associated with block B. Current source I comes from total power consumption of block B: $P=V \times I_{avg}$. FIG. 4 illustrates an example model of a current waveform 48. Because current waveform 48 in the model is a triangle, $$I_{avg} = \frac{1}{2} I_{peak}(T_r + T_f)f,$$

where f is a clock frequency.

RM 46 approximates behavior of a digital circuit for SNA. To make RM 46 more accurate, particular components of reference model 44 are modeled more accurately in RM 46. As more accurate—and hence more complex—models are used, simulation of RM 46 by simulator 42 requires more time and, for large designs, eventually becomes intractable. There is a trade-off between accuracy and scalability.

The package RLC meshes are two-dimensional meshes of RLC networks and represent connections to one or more pins off chip 12. TABLE 1, below, shows effects of a two-dimensional package RLC mesh on SN 10 in reference model 44. SN 10 is attenuated by a package RLC mesh by a factor of approximately three, which indicates that the package RLC meshes should be modeled accurately.

TABLE 1

| Block | SN With Package RLC Mesh (mV) | SN Without Package RLC Mesh (mV) |
|---|---|---|
| A | 26.4 | 88.2 |
| B | 40.2 | 132.9 |

Figure 5A:
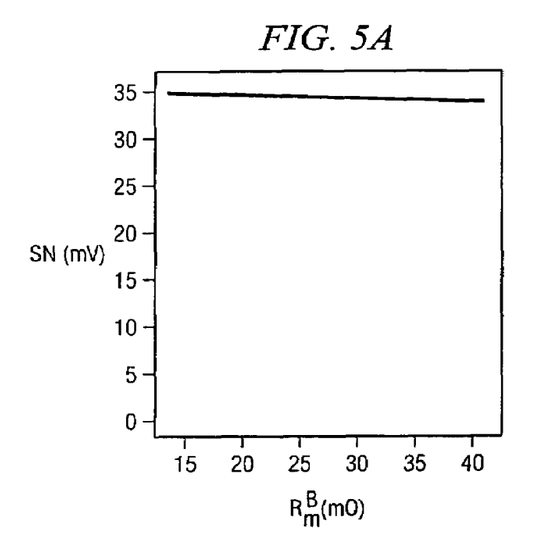
FIG. 5A illustrates an example relationship between SN and the resistance $R_m$ in the RM illustrated in FIG. 3B.
Figure 5B:
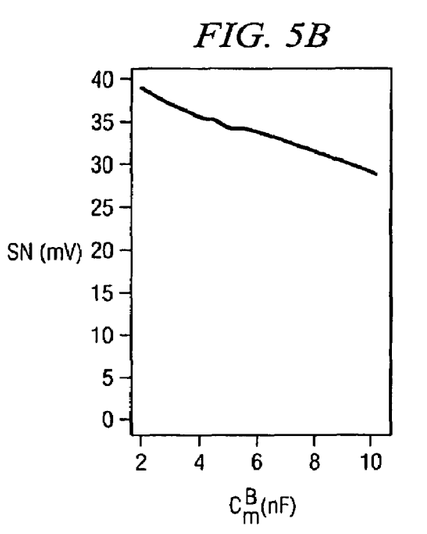
FIG. 5B illustrates an example relationship between SN and the capacitance $C_m$ in the RM illustrated in FIG. 3B.

FIG. 5A illustrates an example relationship between SN 10 and $R_m$ in RM 46. FIG. 5B illustrates an example relationship between SN 10 and $C_m$ in RM 46. Varying $R_m$ has relatively little effect on SN 10. Varying $R_m$ from approximately 15 mΩ to approximately 40 mΩ, i.e., by a factor of approximately 2.7, changes peak-to-peak SN 10 from approximately 34.8 mV to approximately 34.0 mV, i.e., by a factor of approximately 0.98. As a result, computation of $R_m$ need not be very accurate. A computed value of $R_m$ within a factor of approximately 2.5 from an actual value of $R_m$ should not significantly affect SN 10. Varying $C_m$ has a relatively significant effect on SN 10, but not a very significant one. Varying $C_m$ from 2 nF to 10.2 nF, i.e., by a factor of approximately five, changes SN 10 almost linearly from approximately 39.2 mV to approximately 29.0 mV, i.e., by a factor of approximately 0.74.

Figure 6A:
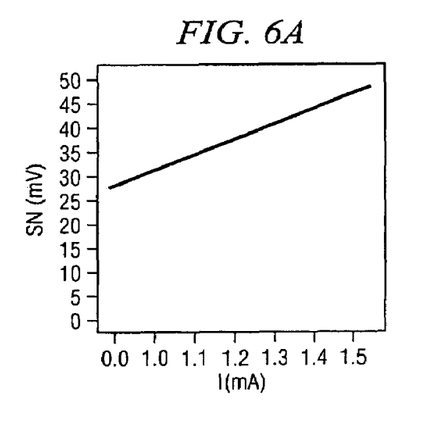
FIGS. 6A and 6B illustrate example relationships between SN and the current source I in the RM illustrated in FIG. 3B.
Figure 6B:
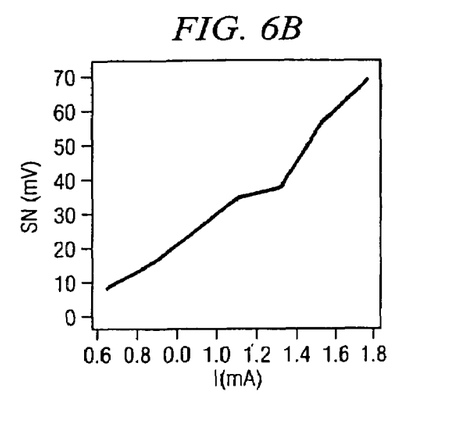

FIGS. 6A and 6B illustrate example relationships between SN 10 and the current source I in RM 46. In FIG. 6A, peak current varies, but $T_r+T_f$ remains constant. In FIG. 6B, both peak current and $T_r+T_f$ but dI/dt remains constant. In both cases, SN 10 is sensitive to both peak current and a shape of current waveform 48. According to the above sensitivity analysis, SN 10 is not sensitive to $R_m$ and only slightly sensitive to $C_m$. Thus, $R_m$ and $C_m$ need not be modeled too accurately. However, SN 10 is sensitive to package model and current waveform 48, so, in particular embodiments, package model and current waveform 48 are accurately modeled.

In particular embodiments, SNA module 24 takes into account switching current, but ignores leakage and subthreshold currents of transistors. Parasitic capacitances charging and discharging in digital logic 18 as transistors in digital logic 18 make transitions generates the switching current. In particular embodiments, SNA module 24 models the switching current of a gate in transition according to the formula $$I(t) = \frac{C \partial V_c(t)}{\partial t}.$$

If capacitance remains constant during the transition and $V_C(t)$ is a ramp function from 0 to $V_{DD}$ (or from $V_{DD}$ to 0) for a rising (or a falling) transition, which are fair approximations, current through load capacitance of a gate is a pulse function with a peak value of $$I = \frac{CV_{DD}}{\Delta T},$$

where $\Delta T$ is transition time. Pulse width is also $\Delta T$. In particular embodiments, current waveform 48 is a superposition of all current pulses of all gates in digital logic 18. No simulation of digital logic 18 need be performed. Unlike previous approaches requiring a model for each input pattern in the testbench, RM 46 is independent of input pattern. Because RM 46 is independent of input pattern, particular embodiments run faster than previous approaches. To generate a pattern-independent model, RM generator 40 accesses timing information from STA tool 36 and uses the timing information to generate an RM 46 that captures worst-case SN 10 over all input patterns.

Timing information from STA tool 36 on each gate g in digital logic 18 includes an arrival window (which includes a minimum arrival time $T_{begin}^g$ and a maximum arrival time $T_{end}^g$), a minimum transition time $\Delta T_{min}^g$, and a maximum transition time $\Delta T_{max}^g$. A transition start time $T_{tran}^g$ lies anywhere in the arrival window. A transition start time may be assigned to each gate g in digital logic 18, i.e., $T_{begin}^g \leq T_{tran}^g \leq T_{end}^g$, such that peak current and, as a result, SN 10, are maximized. Since no logic simulation need be performed to precisely determine which gates g are making transitions, i.e., rising or falling, particular embodiments assume knowledge of switching activity and how many gates are making transitions. Such information is obtainable from a designer of digital logic 18 or from a logic simulation dump generated during design validation.

The following example pseudocode includes an overlapping algorithm that may find a worst-case maximum peak current according to an arrival window, a transition time, and a load capacitance for each gate g in digital logic 18 from STA on digital logic 18:

1. L←list of all switching gates
2. for each gate $g_i \in L$ do
3. $I^{gi} \leftarrow C_{gi} V_{DD} / \Delta T^{gi}$
4. repeat
5. for each gate $g_i \in L$ do
6. $I_{peak}^i \leftarrow I^{gi}$
7. $L_i \leftarrow \{g_i\}$
8. for each gate $g_j \in L (j \approx i)$ do
9. if $T_{begin}^{gi} \leq T_{begin}^{gj} \leq T_{end}^{gi}$ then
10. $I_{peak}^i \leftarrow I_{peak}^i + I^{gj}$
11. $L_i \leftarrow L_i \cup \{g_j\}$
12. $I_{peak} \leftarrow \max_i \{I_{peak}^i\}$
13. $k \leftarrow \arg \max_i \{I_{peak}^i\}$
14. for each gate $g_i \in L_k$ do
15. $T_{tran}^{gi} \leftarrow T_{begin}^{gk}$
16. L←L−$L_k$
17. until L=Φ

In addition to finding a maximum peak current, the above algorithm constructs a current waveform 48. Each iteration (Lines 5 through 16 of the above algorithm) computes a maximum peak current from remaining unselected gates g in digital logic 18, i.e., gates g in list L. Lines 6 through 11 of the above algorithm compute a maximum current $I_{peak}^i$ drawn by each gate $g_i$ at a start point of an arrival window $T_{begin}^{gi}$ of gate $g_i$. To compute the maximum current $I_{peak}^i$, lines 6 through 11 add together currents from all gates $g_j$ having arrival windows that overlap with gate $g_i$. Lines 12 through 13 of the above algorithm then identify a gate $g_k$ drawing a maximum current. The above algorithm sets transition start times for all gates g contributing to the maximum current drawn by gate $g_k$, i.e., all gates g in list $L_k$, to a start point of an arrival window of gate $g_k$. Lines 14 through 16 of the above algorithm then remove the gates g list $L_k$ from list L. Current waveform generator 38 carries out the above iteration until list L becomes empty, i.e., current waveform 48 is constructed.

SNA module 24 invokes the above algorithm once for gates making rising transitions and once for gates making falling transitions. When executed, the above algorithm sorts list L according to start points of arrival windows of the gates. Searching for gates that overlap a particular gate stops if a difference between start points is more than a largest arrival window in the circuit. Using these optimizations, overall complexity of the above algorithm is $O(n^2 \log n)$, where n is the total number of gates in the design.

Figure 7A:
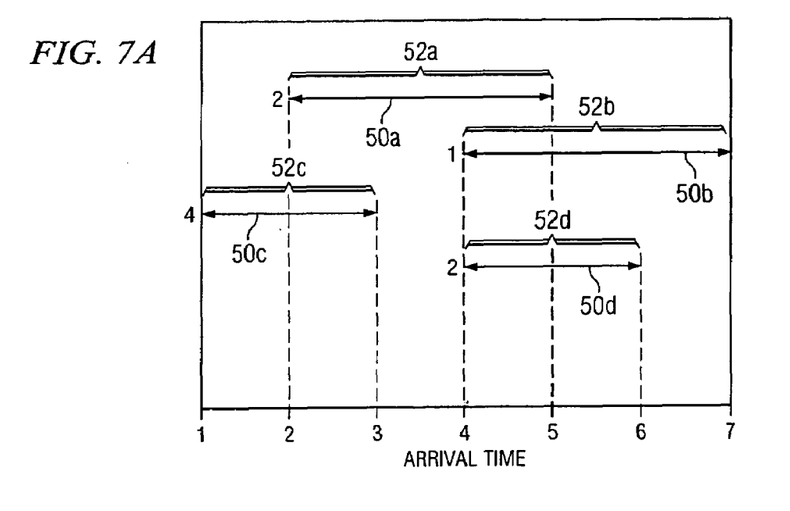
FIG. 7A illustrates example current values in example arrival-time windows.
Figure 7B:
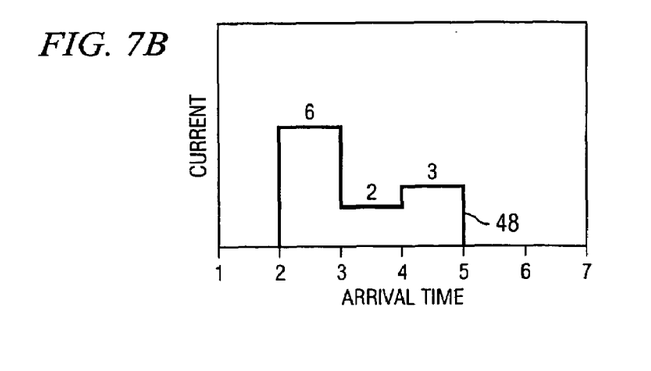
FIG. 7B illustrates an example current waveform derived from the current values in the arrival-time windows illustrated in FIG. 7A.

FIG. 7A illustrates example current values 50 of gates in digital logic 18 in example arrival-time windows 52. FIG. 7B illustrates an example current waveform 48 derived from current values 50 in arrival-time windows 52. Current values 50a, 50b, 50c, and 50d correspond to gates $g_1$, $g_2$, $g_3$, and $g_4$, respectively. Current value 50a equals 2 units between time 1 and time 3, current value 50b equals 1 unit between time 4 and time 7, current value 50c equals 4 units between time 1 and time 3, current value 50d equals 2 units between time 4 and 6. Arrival-time window 52a of gate g1 lies between time 2 and time 5, arrival-time window 52b of gate g2 lies between time 4 and time 7, arrival-time window 52c of gate g3 lies between time 1 and time 3, arrival-time window 52d of gate g4 lies between time 4 and time 6. Thus, $T_{begin}^{g1}=2$, $T_{end}^{g1}=5$, $I^{g1}=2$, and so on. Maximum current at time 1, which is a start point for $g_3$, is 4 units; maximum current at time 2, which is a start point for $g_1$, is 6 units; and maximum current at time 4, which is a start point for $g_2$ and $g_4$ is 5 units. Hence, maximum current is 6 units, transition start time for $g_1$ and $g_3$ is set to time 2, and $g_1$ and $g_3$ are removed from the list. The next maximum occurs at time 4 for $g_2$ and $g_4$. To generate current waveform 48, current waveform generator 38 superimposes current pulses for gates $g_1$, $g_2$, $g_3$, and $g_4$ onto each other. The duration of a current pulse for a gate is equal to the minimum transition time of that gate, which takes care of a worst-case condition. Assume a minimum transition time for $g_1$ is 2 units and, for $g_2$, $g_3$, and $g_4$, 1 unit each.

Figure 8:
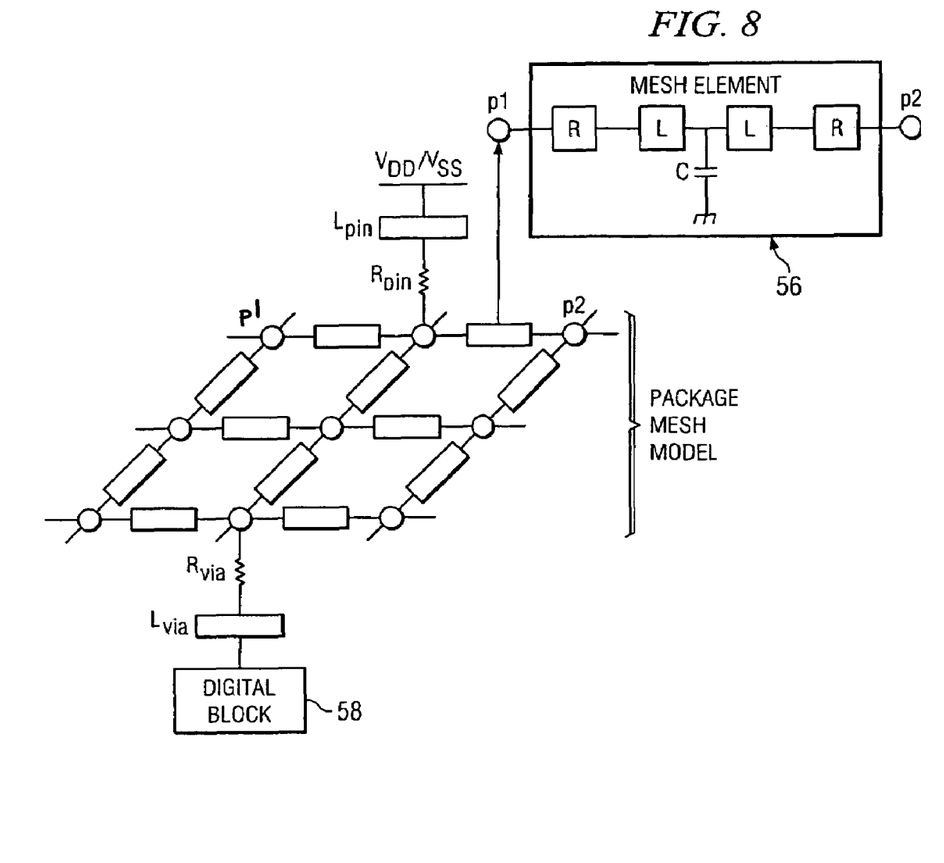
FIG. 8 illustrates an example package RLC mesh.

FIG. 8 illustrates an example package RLC mesh 56. Package RLC mesh 56 is an abstraction of power and ground planes in package 12. Because inductance associated with package 12 directly affects $$L \frac{di}{dt}$$

noise, package 12 significantly affects power supply noise. In particular embodiments, SNA module 24 calculates inductance L, sheet resistance R, and capacitance C from layer information. $L_{pin}$ and $R_{pin}$ connect package RLC mesh 56 to $V_{DD}$ and $V_{SS}$, and $L_{via}$ and $R_{via}$ connect package RLC mesh 56 to digital block 58.

The reduced model presented above was validated against the reference model. Since reference models for large circuits cannot be simulated due to exorbitant CPU-times, the reduced model can only be validated for relatively small circuits. Several circuits were generated with sizes varying from 50 to 700 gates. In these experiments, the technology is 0.11-μ, with VDD=1.2V.

The results for the pattern-independent methodology (PIM) are presented. The reference model for each circuit was simulated with a testbench which had less than 10 vectors. The peak-to-peak substrate voltage over the entire testbench was measured. For PIM, the current waveform and the reduced model were generated based on the timing windows obtained from a static timing analysis tool, as described above. The switching ratios used to generate the reduced model were calculated from the testbench used in the reference model. The reduced model was simulated and peak-to-peak substrate noise voltage measured.

Table 2 shows results of the peak-to-peak substrate noise voltage comparisons. The noise measured using the reduced model in the pattern-independent flow is close to that measured by the reference model: on average the difference is 16.4%. However, there is a dramatic improvement in the CPU time, which is the total time for generating the model and simulating it. The PIM is 17.8 times faster on average and for c6 and c7, more than 30 times faster. Note that the CPU time for the reference model increases linearly with the number of cycles. In our experiments, the reference model was simulated for a very small number of cycles. Larger designs need exponentially more cycles, especially if the worst- or near-worst-case noise patterns are to be captured. Correspondingly, CPU times for the reference model simulation increase exponentially. However, for PIM, the time grows linearly with the design size, since model generation time is linear in the design size. The simulation time does not depend on the number of input patterns. Therefore, the speedup using the methodology will be even higher for large designs.

TABLE 2

Substrate noise results

| ckt | gate cnt | Noise (mV) | | | CPU Times (secs) | | |
|-----|----------|------|------|-------|------|-----|------|
|     |          | ref  | red  | % err | ref  | red | X    |
| c1  | 137      | 12.4 | 10.9 | −12.0 | 785  | 87  | 9.0  |
| c2  | 281      | 22.9 | 16.1 | −29.8 | 1778 | 89  | 20.0 |
| c3  | 57       | 3.9  | 3.3  | −15.6 | 349  | 76  | 4.6  |
| c4  | 99       | 7.6  | 6.6  | −13.0 | 538  | 85  | 6.3  |
| c5  | 224      | 11.2 | 11.8 | 5.2   | 1339 | 88  | 15.2 |
| c6  | 701      | 42.6 | 39.3 | −7.9  | 2525 | 81  | 31.2 |
| c7  | 464      | 18.7 | 24.5 | 31.0  | 3660 | 95  | 38.5 |
| avg |          |      |      | 16.4  |      |     | 17.8 | ref: peak-to-peak substrate noise for reference model
red: peak-to-peak substrate noise for reduced model
err = (red − ref)/ref;
X: CPU time speed-up For a chip-level design, it is not possible to measure the substrate noise by a detailed SPICE model. The following methodology is used to handle the chip complexity. It exploits the hierarchical nature of the design. It takes three inputs: design information, cell libraries and technology parameters. Design information consists of gate netlist, chip floor plan, package size and parameters. Cell libraries include timing libraries and SPICE models. Technology parameters include process information such as sheet resistances of metal layers, capacitance, etc. The output is the substrate noise level for each hierarchical block.

Figure 9:
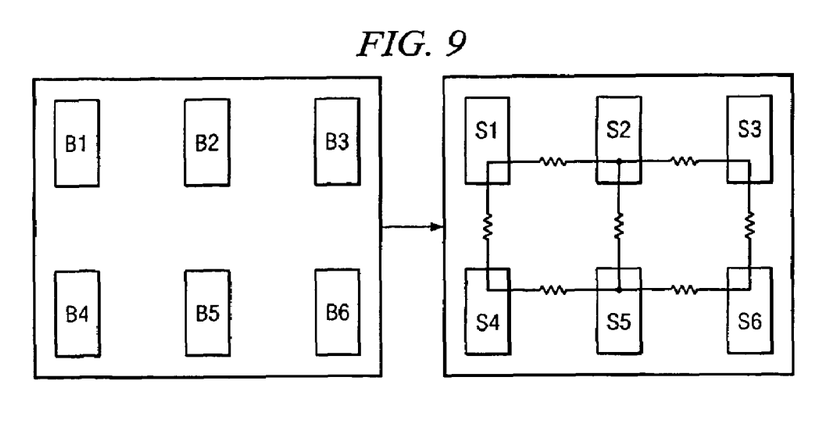
FIG. 9 illustrates example analysis of a chip-level design.

The main steps of the methodology are as follows. First, the reduced model $M_i$ of each block $B_i$ is derived, as described above. Let the substrate in each block $B_i$ be $S_i$ (FIG. 9). The reduced block models are then composed to generate a single chip-level model M. The relative placement of the blocks in the floor plan is used to derive M. If blocks $B_i$ and $B_j$ are physically adjacent in the floor plan, their corresponding substrate nodes $S_i$ and $S_j$ are connected through a resistor $R_{ij}$. The value of $R_{ij}$ is computed using the sizes of the blocks and sheet resistance of the bulk. After combining the composed model with the package model, SPICE simulation is performed and SN is measured for each block.

The methodology was applied to a mixed-signal, switch chip. The analog components of this chip are the high-speed I/O macros. The gate count is 8 million. The chip has 34 top-level blocks, each block consisting of hundreds of thousands of gates. The modeling was only concerned about P2P SN. The designers provided the switching activity for each block. The results were as follows. The complete simulation finished in 17 minutes. The maximum value of P2P SN over all S nodes was 40.7 mV, the average being 34.5 mV. The designers had specified a threshold of 60 mV, which was met.

Figure 10:
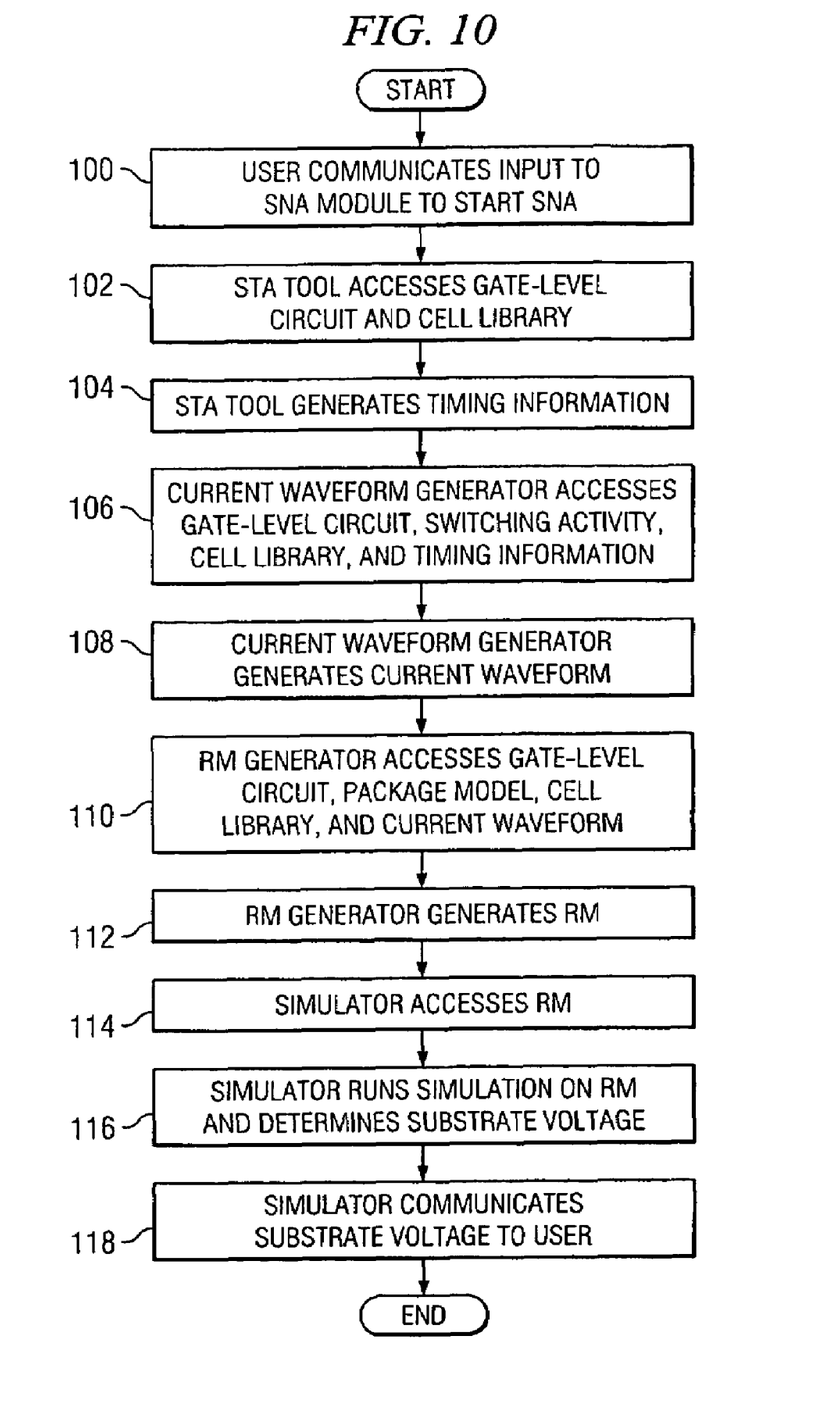
FIG. 10 illustrates an example method for analyzing SN.

FIG. 10 illustrates an example method for analyzing SN. The method begins at step 100, where a user communicates input to SNA module 24 to start SNA of a chip 12. At step 102, STA tool 36 accesses description 26 of digital logic 18 and cell library 34. At step 104, STA tool 36 executes an STA algorithm using description 26 and cell library 34 to generate timing information on each gate in digital logic 18 in chip 12. At step 106, current waveform generator 38 accesses description 26 of digital logic 18, description 28 of switching activity in digital logic 18, cell library 34, and the timing information from STA tool 36. At step 108, current waveform generator 38 executes a CWG algorithm using descriptions 26 and 28, cell library 34, and the timing information to generate a current waveform 48. At step 110, RM generator 40 accesses description 26 of digital logic 18, description 30 of package 12, cell library 34, and current waveform 48.

At step 112, RM generator 40 executes an algorithm using descriptions 26 and 30, cell library 34, and current waveform 48 to generate an RM 46 of digital logic 18 for simulation. As described above, RM 46 includes relatively few, passive components, which speeds up simulation of RM 46. Because RM 46 does not include any explicit primary inputs, RM 46 is independent of an input pattern. At step 114, simulator 42 accesses RM 46. At step 116, simulator 42 runs a simulation on RM 46 and determines a voltage across substrate 22. At step 118, simulator 42 communicates the determined voltage across substrate 22 to the user, at which point the method ends. Although particular steps of the method illustrated in FIG. 10 are illustrated and described as occurring in a particular order, the present invention contemplates any suitable steps of the method illustrated in FIG. 10 occurring in any suitable order.

One or more modifications to the present invention may be apparent to a person having ordinary skill in the art, and the present invention encompasses all such modifications within the scope of the appended claims. Statements in the specification that are not reflected in the appended claims do not limit the present invention in any way.

What is claimed is:

1. A system for analyzing substrate noise (SN), the system comprising:
    a static timing analysis (STA) module operable to apply an STA algorithm to a description of a digital circuit, application of the STA algorithm generating timing information on one or more gates in the digital circuit;

a current waveform generator operable to apply a current waveform generation (CWG) algorithm to the description of the digital circuit, the timing information on one or more gates in the digital circuit, and a description of switching activity in the digital circuit, application of the CWG algorithm generating a current waveform; and a reduced model (RM) generator operable to generate an RM of the digital circuit for simulation, the RM generator generating the RM of the digital circuit according to the description of the digital circuit, the current waveform, and a model of a package associated with the digital circuit, simulation of the RM of the digital circuit generating an indication of noise in a substrate associated with the digital circuit.

2. The system of claim 1, wherein the timing information comprises worst-case timing in the digital circuit over a plurality of input patterns to the digital circuit.

3. The system of claim 2, wherein the timing information comprises worst-case timing in the digital circuit over all possible input patterns to the digital circuit.

4. The system of claim 1, wherein the CWG algorithm comprises an overlapping algorithm operable to generate one or more maximum peak currents of one or more gates in the digital circuit in one or more time windows.

5. The system of claim 1, wherein the RM comprises only passive elements.

6. The system of claim 1, wherein the RM comprises only a few elements.

7. The system of claim 1, wherein the RM derives from a sensitivity analysis.

8. The system of claim 1, wherein the RM is independent of input pattern to the digital circuit.

9. The system of claim 1, wherein the indication of noise in the substrate comprises a peak-to-peak value.

10. The system of claim 9, wherein the indication of noise comprises a maximum peak-to-peak value.

11. The system of claim 1, wherein the substrate is associated with analog circuitry in addition to being associated with the digital circuit.

12. A method for analyzing substrate noise (SN), the method comprising:

applying a static timing analysis (STA) algorithm to a description of a digital circuit, application of the STA algorithm generating timing information on one or more gates in the digital circuit;

applying a current waveform generation (CWG) algorithm to the description of the digital circuit, the timing information on one or more gates in the digital circuit, and a description of switching activity in the digital circuit, application of the CWG algorithm generating a current waveform; and generating a reduced model (RM) of the digital circuit for simulation according to the description of the digital circuit, the current waveform, and a model of a package associated with the digital circuit, simulation of the RM of the digital circuit generating an indication of noise in a substrate associated with the digital circuit.

13. The method of claim 12, wherein the timing information comprises worst-case timing in the digital circuit over a plurality of input patterns to the digital circuit.

14. The method of claim 13, wherein the timing information comprises worst-case timing in the digital circuit over all possible input patterns to the digital circuit.

15. The method of claim 12, wherein the CWG algorithm comprises an overlapping algorithm operable to generate one or more maximum peak currents of one or more gates in the digital circuit in one or more time windows.

16. The method of claim 12, wherein the RM comprises only passive elements.

17. The method of claim 12, wherein the RM comprises only a few elements.

18. The method of claim 12, wherein the RM derives from a sensitivity analysis.

19. The method of claim 12, wherein the RM is independent of input pattern to the digital circuit.

20. The method of claim 12, wherein the indication of noise in the substrate comprises a peak-to-peak value.

21. The method of claim 20, wherein the indication of noise comprises a maximum peak-to-peak value.

22. The method of claim 12, wherein the substrate is associated with analog circuitry in addition to being associated with the digital circuit.

23. Software for analyzing substrate noise (SN), the software encoded in a computer-readable medium and when executed operable to:

apply a static timing analysis (STA) algorithm to a description of a digital circuit, application of the STA algorithm generating timing information on one or more gates in the digital circuit;

apply a current waveform generation (CWG) algorithm to the description of the digital circuit, the timing information on one or more gates in the digital circuit, and a description of switching activity in the digital circuit, application of the CWG algorithm generating a current waveform; and generate a reduced model (RM) of the digital circuit for simulation according to the description of the digital circuit, the current waveform, and a model of a package associated with the digital circuit, simulation of the RM of the digital circuit generating an indication of noise in a substrate associated with the digital circuit.

24. The software of claim 23, wherein the timing information comprises worst-case timing in the digital circuit over a plurality of input patterns to the digital circuit.

25. The software of claim 24, wherein the timing information comprises worst-case timing in the digital circuit over all possible input patterns to the digital circuit.

26. The software of claim 23, wherein the CWG algorithm comprises an overlapping algorithm operable to generate one or more maximum peak currents of one or more gates in the digital circuit in one or more time windows.

27. The software of claim 23, wherein the RM comprises only passive elements.

28. The software of claim 23, wherein the RM comprises only a few elements.

29. The software of claim 23, wherein the RM derives from a sensitivity analysis.

30. The software of claim 23, wherein the RM is independent of input pattern to the digital circuit.

31. The software of claim 23, wherein the indication of noise in the substrate comprises a peak-to-peak value.

32. The software of claim 31, wherein the indication of noise comprises a maximum peak-to-peak value.

33. The software of claim 23, wherein the substrate is associated with analog circuitry in addition to being associated with the digital circuit.

34. A system for analyzing substrate noise (SN), the system comprising:

means for applying a static timing analysis (STA) algorithm to a description of a digital circuit, application of the STA algorithm generating timing information on one or more gates in the digital circuit;

means for applying a current waveform generation (CWG) algorithm to the description of the digital circuit, the timing information on one or more gates in the digital circuit, and a description of switching activity in the digital circuit, application of the CWG algorithm generating a current waveform; and means for generating a reduced model (RM) of the digital circuit for simulation according to the description of the digital circuit, the current waveform, and a model of a package associated with the digital circuit, simulation of the RM of the digital circuit generating an indication of noise in a substrate associated with the digital circuit.

* * * * *

UNITED STATES PATENT AND TRADEMARK OFFICE
CERTIFICATE OF CORRECTION

| | |
|---|---|
| PATENT NO. | : 7,246,335 B2 |
| APPLICATION NO. | : 11/058900 |
| DATED | : July 17, 2007 |
| INVENTOR(S) | : Rajeev Murgai et al. |

It is certified that error appears in the above-identified patent and that said Letters Patent is hereby corrected as shown below:

Title Page 1, Other Publications, Right Column, Line 4, after "Substrate" delete "Nosie" and insert -- Noise --.

Title Page 1, Other Publications, Right Column, Line 7, before "et al.," delete "Braire" and insert -- Briaire --.

Column 6, Line 40, after "$T_r + T_f$" insert -- vary, --.

Signed and Sealed this

Second Day of June, 2009

JOHN DOLL
*Acting Director of the United States Patent and Trademark Office*